United States Patent [19]
Fontenot et al.

[11] Patent Number: 6,076,177
[45] Date of Patent: Jun. 13, 2000

[54] METHOD AND APPARATUS FOR TESTING A CIRCUIT MODULE CONCURRENTLY WITH A NON-VOLATILE MEMORY OPERATION IN A MULTI-MODULE DATA PROCESSING SYSTEM

[75] Inventors: Ivan James Fontenot, Austin; Thomas R. Toms, Drippings Springs, both of Tex.

[73] Assignee: Motorola, Inc., Schaumburg, Ill.

[21] Appl. No.: 08/935,572

[22] Filed: Sep. 23, 1997

[51] Int. Cl.[7] ........................... G01R 31/28; H05K 10/00
[52] U.S. Cl. ................... 714/724; 714/30; 714/37
[58] Field of Search ................................ 714/724, 725, 714/733, 734, 30, 31, 32, 33, 37, 39, 726, 731

[56] References Cited

U.S. PATENT DOCUMENTS

| | | | |
|---|---|---|---|
| 5,025,205 | 6/1991 | Mydill et al. ........................... | 714/724 |
| 5,432,797 | 7/1995 | Takano .................................. | 714/738 |
| 5,581,510 | 12/1996 | Furusho et al. ......................... | 365/201 |
| 5,615,216 | 3/1997 | Saeki ..................................... | 714/724 |

*Primary Examiner*—Trinh L. Tu
*Attorney, Agent, or Firm*—Daniel D. Hill; Craig J. Yudell; George R. Meyer

[57] ABSTRACT

Testing of a multi-module data processing system (20) includes performing a functional test on a module (42, 44, 46, 48, 50, 54) concurrently with an erase operation of a non-volatile memory module (34, 36). Because the erase operation requires multiple clock cycles to complete, and little or no interaction with a tester, a set of test patterns may be run on one or more of the modules (42, 44, 46, 48, 50, 54) while the erase operation is being performed. Between each test pattern, a special reset signal is provided to a reset unit (39) of a system integration unit (38). The special reset signal resets the modules (42, 44, 46, 48, 50, 54), without affecting the erase operation of the flash memory module (34, 36), in order to perform each test of the modules (42, 44, 46, 48, 50, 54) from a known state. Concurrent testing in this manner reduces the time required to test a multi-module data processing system.

20 Claims, 2 Drawing Sheets

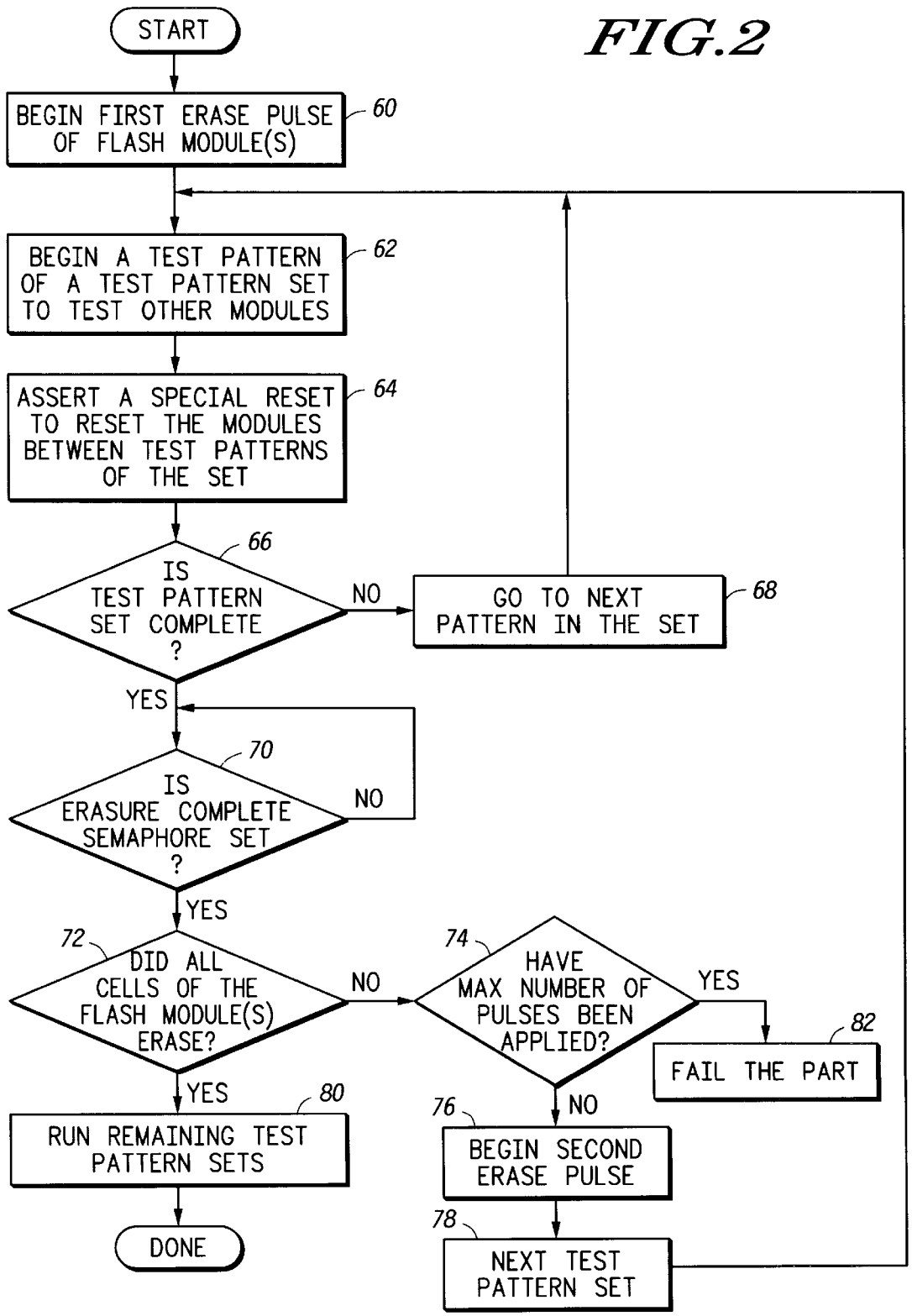

METHOD AND APPARATUS FOR TESTING A CIRCUIT MODULE CONCURRENTLY WITH A NON-VOLATILE MEMORY OPERATION IN A MULTI-MODULE DATA PROCESSING SYSTEM

FIELD OF THE INVENTION

The present invention relates generally to integrated circuit testing and, more particularly, to testing a circuit module concurrently with a non-volatile memory operation of a multi-module data processing system.

BACKGROUND OF THE INVENTION

Data processing systems such as integrated circuit microcontrollers generally include a central processing unit (CPU) and a number of peripheral circuit modules. The circuit modules may include circuits for performing a particular function, such as for example, analog-to-digital converters, serial and peripheral interface modules, time processing units, memory modules, etc. The memory modules may include any type of memory, such as for example, static random access memory (SRAM), dynamic random access memory (DRAM) flash memory or electrically erasable programmable read only memory (EEPROM).

Generally, as part of the integrated circuit manufacturing process, each of these modules are tested one at a time to assure they function within required specifications. As the size and complexity of these multi-module data processing systems increases, the time required to test the CPU and the circuit modules increases. The testing portion of a complex data processing system can be a major time and cost factor in the integrated circuit manufacturing process. Therefore, a way to reduce the time required for testing a complex multi-module data processing system is needed.

BRIEF DESCRIPTION OF THE DRAWINGS

FIG. 2 illustrates, in flow diagram form, a method for concurrently testing a module during an erase operation of a flash memory module.

DESCRIPTION OF A PREFERRED EMBODIMENT

Figure 1:
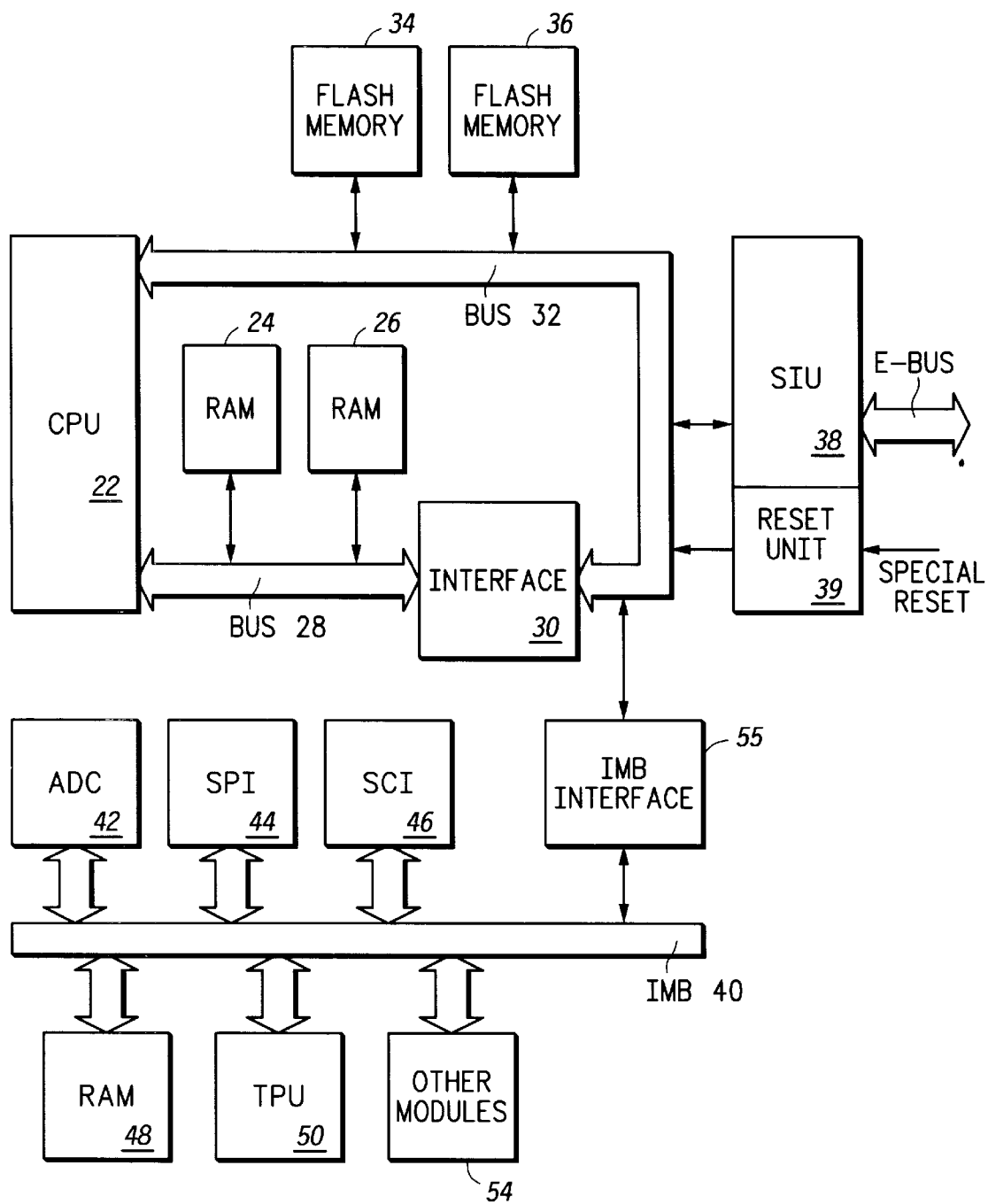
FIG. 1 illustrates, in block diagram form, a multi-module data processing system in accordance with the present invention.

Generally, the present invention provides a multi-module data processing system and a method for performing a functional test on a circuit module concurrently with an erase operation of a non-volatile memory module, such as a flash memory, to reduce the time required for testing to multi-module data processing system. Also, the concurrent testing is accomplished without the non-volatile memory module having the additional circuitry required for performing a full built-in self-test (BIST). The testing of a circuit module may be performed concurrently with an erase operation in the flash memory module because little interaction with the tester is required during the erase operation. Specifically, during testing, an erase operation of flash memory module is begun. During the erasure, a set of test patterns are run on one or more of the other modules of the data processing system. Between each test pattern of the test pattern set, a special reset signal is provided to a reset unit of a system integration unit. The special reset signal resets all of the other modules of the data processing system without affecting the erasure operation of the flash memory modules. The special reset allows the starting point for each of the test patterns to be started from a known state. The present invention is more fully described with reference to FIGS. 1 and 2.

FIG. 1 illustrates, in block diagram form, multi-module data processing system 20 in according with the present invention. Data processing system 20 includes central processing unit (CPU) 22, random access memory (RAM) 24 and RAM 26, buses 28 and 32, flash memory modules 34 and 36, interface 30, system integration unit (SIU) 38, analog-to-digital (ADC) converter module 42, serial peripheral interface (SPI) module 44, serial communication interface (SCI) module 46, intermodule bus (IMB) interface 55, IMB bus 40, RAM module 48, time processing unit (TPU) 50, and other modules 54. SIU 38 includes reset unit 39.

CPU 22 includes a first plurality of terminals coupled to bus 32 and a second plurality of terminals coupled to data bus 28. Bus 32 is generally for communicating instructions and data to other portions of data processing system 20. Bus 28 is generally for communicating information from RAMs 24 and 26. Flash memory modules 34 and 36 are both bi-directionally coupled to bus 32. Flash memory modules 34 and 36 are conventional flash memory units which include an array of floating gate transistor memory cells. SIU 38 is bi-directionally coupled to bus 32 and is also bi-directionally coupled to an external bus, labeled "E-BUS" for communicating instructions and/or data to other integrated circuits external to data processing system 20.

RAM 24 and RAM 26 are both bi-directionally coupled to bus 28. Interface 30 is coupled to bus 28 and bus 32 to provide an interface between the buses 28 and 32, as well as for providing memory protection for RAM 24 and RAM 26. Intermodule bus 40 is coupled to bus 32 via intermodule bus interface 55. A plurality of other peripheral circuit modules are coupled to intermodule bus 40. Note that these modules provide special functions for data processing system 20, and may be different for other embodiments depending on the specific application. The illustrated embodiment includes ADC module 42, SPI module 44, SCI module 46, RAM module 48, TPU 50, and a block representing other modules 54. Each of the modules is bi-directionally coupled to intermodule bus 40. Other modules 54 may include additional memory, other communications modules, or control modules, depending upon the particular application. Note that a module is a group of circuit elements organized in order to perform a predetermined function. Each module functions independently from the other modules.

Reset unit 39 of SIU 38 receives an external reset signal labeled "SPECIAL RESET". In response to receiving SPECIAL RESET, reset unit 39 provides a reset control signal from reset unit 39 to the modules of data processing system 20 as part of the control signal path of buses 28, 32, and 40 to reset all of the modules on data processing system except for flash memory modules 34 and 36. Flash memory modules 34 and 36 do not receive and are not reset by reset signal SPECIAL RESET. The function of reset signal SPECIAL RESET will be described below.

In the illustrated embodiment, during normal operation of data processing system 20, an external pin, or terminal, is used to provide a dual function of both SPECIAL RESET in addition to a conventional "hardware" reset. Reset signal SPECIAL RESET is active when data processing system 20 is configured and functioning in a concurrent test mode. Otherwise, the conventional hardware reset is active. To enter the concurrent test mode of data processing system 20, data processing system 20 is first entered into test mode and a special reset bit (not shown) is set in reset unit 39 and reset signal SPECIAL RESET is provided to the external pin. During normal operation, the special reset bit is disabled, allowing the conventional hardware reset to function.

While data processing system 20 is in the concurrent test mode, test patterns, which are generated by an external tester (not shown), are provided to data processing system 20 via bi-directional bus E-BUS and system integration unit 38. Generally, the modules of data processing system 20, except for CPU 22, are tested while in a slave mode of operation where the test signals are provided to the appropriate module via bus 32, bus 28, or bus 40. Alternately, the modules of data processing system 20 could be tested in a master mode, where the testing of the modules would be controlled by CPU 22.

When reset signal SPECIAL RESET is asserted, SIU 38 provides the reset control signals to reset each of the modules of data processing system 20 except for the flash memory modules 34 and 36. In contrast, a conventional hardware reset would reset all of the modules of data processing system 20, including flash memory modules 34 and 36.

An erase operation of a conventional flash memory cell can require multiple system clock/bus cycles. Also, a normal test flow may require that the flash memory be erased a number of times. This can significantly increase the time required to test an integrated circuit having flash memory. The present invention shortens testing time of data processing system 20 by more efficiently utilizing the tester to perform tests of other modules during a flash memory erase operation, or during another type of multi-bus cycle operation that requires little or no interaction with the tester or access to the bus. Because testing other modules concurrently with a flash memory operation decreases the test time, testing costs are decreased, thereby decreasing the manufacturing cost of the integrated circuit having multi-module data processing system 20.

FIG. 2 illustrates, in flow diagram form, a method for testing modules of data processing system 20 concurrently with an erase operation of flash memory modules 34 or 36. Generally, when erasing a flash memory cell, the erasure is accomplished using one or more erase pulses to the control gate of the floating gate transistor. After each erase pulse, the flash memory cell is checked to see if erasure has been completed. To complete an erasure may require several erase pulses and multiple bus cycles of data processing system 20.

During the concurrent testing of data processing system 20 in accordance with the present invention, the concurrent test mode is entered by setting the special reset bit of reset unit 39, described above, thus making the reset signal SPECIAL RESET functional. At step 60, a first erase pulse of flash memory module 34 and/or flash memory 36 module is provided to begin erasing the flash memory. The erase operation may, or may not, be for the purpose of testing the flash memory itself, and is conducted as part of a procedure for testing data processing system 20. The flash memory modules 34 and 36 may be erased a number of times. If both of the flash memories are to be erased in parallel, the first erase pulses are provided to each flash memory module serially. Note that in other embodiments, there may be fewer than, or more than, the two flash memory units illustrated in FIG. 1.

During the first erase pulse, at step 62, a test pattern of a test pattern set is run by the tester to test one or more other modules of data processing system 20. At step 64, reset signal SPECIAL RESET is asserted to reset the module(s) being tested to an initial state following the test pattern. The reset signal SPECIAL RESET does not affect the erase operation of the flash memory module. At decision step 66, it is determined if the test pattern set is complete. If there are still more test patterns within the test pattern set to run, then the NO path is taken to step 68, and the next pattern in the set is run. Steps 62 and 64 are repeated until the entire test pattern set is complete. The number of test patterns that can be run during the erase pulse depends on the length of the erase pulse and the run time of the test patterns. Note that, although not shown and not important for describing the present invention, data processing system 20 may fail during the running of any of the test patterns, causing testing to be terminated before running the entire testing procedure. Also, if data processing system 20 includes more than one of the same type of module, testing of those modules may be done in parallel, or at the same time.

Assuming that data processing system 20 does not fail any of the test patterns, reset signal SPECIAL RESET is asserted to reset each of the tested modules to its initial state between each of the test patterns of the set of test patterns. This allows each of the tests to be performed from a known or initial state or condition. When the test pattern set is complete, the YES path is taken from decision step 66 to decision step 70.

Associated with each of the flash memory units is a special semaphore bit (not shown), which is set after the erase operation to indicate when erasure is complete. At decision step 70, after the test pattern set is complete, it is determined if an erasure complete semaphore has been set. If the semaphore bit is not set, indicating that the erasure has not yet been completed, the NO path is taken back the beginning of decision step 70. If the erase operation is complete, the YES path is taken to decision step 72. At decision step 72, it is determined if all of the memory cells of the flash memory module erased. If not, the NO path is taken to decision step 74 and it is determined if the maximum number of erase pulses have been applied to the flash memories. If the maximum number of erase pulse have been applied, the YES path is taken to step 82, indicating that the erasure has failed, and failure processing occurs. If all of the memory cells of the flash module were successfully erased, the YES path is taken from decision step 72 to step 80 and the remaining test pattern sets are run.

At decision step 74, if the maximum number of erase pulses have not yet been applied, the NO path is taken to step 76 and a second erase pulse is asserted to begin another erase operation of the flash memory module. Also, at step 78, a next test pattern set is begun, if additional testing is required, and test flow is repeated beginning at step 62. If more than two erase pulses are required to erase the flash memory cells, the appropriate steps of FIG. 2 are repeated until either failure of the flash memory or one of the other modules occurs or the flash memory is successfully erased and testing completed.

By testing a module of multi-module data processing system 20 concurrently with a non-volatile memory operation, an increase in effective test efficiency is realized, without the surface area penalty of an integrated circuit having a non-volatile memory with a BIST capability.

While the invention has been described in the context of a preferred embodiment, it will be apparent to those skilled in the art that the present invention may be modified in numerous ways and may assume many embodiments other than that specifically set out and described above. For example, in another embodiment, the erase operation may be a program operation of a non-volatile memory. Also, the concurrent testing may be conducted for any module requiring multiple clock/bus cycles to perform a task without bus or tester interaction, such as for example, during a conversion operation of an analog-to-digital converter. In addition, the erase or program operation of the flash memory may be replaced with an erase or program operation of another type of non-volatile memory, such as for example, of an electrically erasable programmable read-only memory (EEPROM), or an erasable programmable read-only memory (EPROM), or a one-time programmable memory (OTP). Accordingly, it is intended by the appended claims to cover all modifications of the invention which fall within the true scope of the invention.

What is claimed is:

1. A method of testing an integrated circuit having a plurality of modules intercoupled by a bus, the method comprising the steps of:

initiating a multi-clock operation in a first module of the plurality of modules;

performing the multi-clock operation in the first module without accessing the bus;

performing a first test operation in a second module of the plurality of modules while concurrently performing the multi-clock operation, wherein an access to the bus is required while performing the first test operation;

completing the multi-clock operation and the first test operation; and configuring the integrated circuit in a test mode for concurrent testing of two or more of the plurality of modules, wherein the step of configuring the integrated circuit in a test mode for concurrent testing of two or more of the plurality of modules includes configuring a first reset path for the first module and a second reset path for the second module.

2. The method according to claim 1, further comprising the step of:

resetting the second module a plurality of times while concurrently performing the multi-clock operation in the first module.

3. The method according to claim 1, wherein the step of configuring the integrated circuit in a test mode for concurrent testing of two or more of the plurality of modules includes activating a special reset bit.

4. The method according to claim 1, further comprising the step of resetting the second module via the second reset path without resetting the first module during the multi-clock operation.

5. The method according to claim 1, further comprising the step of performing a second test operation in the second module of the plurality of modules while concurrently performing the multi-clock operation, wherein an access to the bus is required while performing the second test operation.

6. The method according to claim 5, further comprising the step of resetting the second module prior to performing the second test operation without resetting the first module.

7. The method according to claim 1, further comprising the step of performing a second test operation in a third module of the plurality of modules while concurrently performing the multi-clock operation, wherein an access to the bus is required while performing the second test operation.

8. The method according to claim 1, wherein the multi-clock operation is an erase operation of a non-volatile memory device.

9. The method according to claim 1, wherein the multi-clock operation is a programming operation of a non-volatile memory device.

10. The method according to claim 1, wherein the first test operation includes executing a test pattern within the second module.

11. The method according to claim 1, wherein the step of completing the multi-clock operation includes accessing the bus.

12. An integrated circuit, comprising:

a plurality of modules including a first module and a second module, wherein the first module performs a different function than the second module and wherein a first operation may be performed on the first module concurrently with a test operation being performed on the second module; and a reset unit providing a first reset signal to the first module and a second reset signal to the second module, wherein the second module is reset by the second reset signal while the first module is performing a memory operation.

13. The integrated circuit of claim 12, wherein the first module includes a flash memory.

14. The integrated circuit of claim 12, wherein the second module performs a circuit function that is independent of a circuit function of the first module.

15. The integrated circuit of claim 12, further comprising a third module of the plurality of modules that is reset by the second reset signal.

16. An integrated circuit, comprising:

a plurality of modules including a first module and a second module, wherein the first module performs a different function than the second module and wherein a first operation may be performed on the first module concurrently with a test operation being performed on the second module; and a reset unit providing a reset signal to the second module, wherein the second module is reset by the reset signal while the first module is performing the first operation.

17. The integrated circuit of claim 16, wherein the first module comprises a non-volatile memory and the first operation comprises an erase operation to erase the non-volatile memory.

18. The integrated circuit of claim 16, wherein the reset unit comprises a special reset bit for modifying behavior of the reset unit when a test mode is entered.

19. A method of testing an integrated circuit having a plurality of modules intercoupled by a bus, the method comprising the steps of:

initiating a multi-clock operation in a first module of the plurality of modules;

performing the multi-clock operation in the first module;

providing a reset signal to a second module of the plurality of modules to reset the second module while concurrently performing the multi-clock operation in the first module; and after resetting the second module, performing a first test operation in the second module while concurrently performing the multi-clock operation in the first module.

20. The method according to claim 19, further comprising the steps of:

repeating said step of providing the reset signal to the second module to reset the second module a second time while concurrently performing the multi-clock operation in the first module; and after resetting the second module for the second time, performing a second test operation in the second module while concurrently performing the multi-clock operation in the first module.

* * * * *